US007759160B2

(12) United States Patent
Mattila et al.

(10) Patent No.: US 7,759,160 B2
(45) Date of Patent: Jul. 20, 2010

(54) METHOD FOR PRODUCING CONDUCTOR STRUCTURES AND APPLICATIONS THEREOF

(75) Inventors: Tomi Mattila, Espoo (FI); Ari Alastalo, Klaukkala (FI); Mark Allen, Espoo (FI); Heikki Seppä, Helsinki (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 175 days.

(21) Appl. No.: 12/155,669

(22) Filed: Jun. 6, 2008

(65) Prior Publication Data

US 2009/0014821 A1    Jan. 15, 2009

(30) Foreign Application Priority Data

Jun. 8, 2007   (FI)   ............................ 20075430

(51) Int. Cl.
 *H01L 21/44* (2006.01)
(52) U.S. Cl. .................. 438/101; 438/99; 438/100; 438/127; 257/E21.007; 257/E21.015; 977/762; 977/773
(58) Field of Classification Search ................. 438/101, 438/141, 422; 257/E21.007, E21.014, E21.015; 977/700, 721, 809
See application file for complete search history.

(56) References Cited

U.S. PATENT DOCUMENTS 5,471,163 A    11/1995   Childers

2004/0085797 A1   5/2004   Mei et al.
2006/0049486 A1   3/2006   Chaudhari
2007/0099345 A1*  5/2007   Bauer et al. .................. 438/107

FOREIGN PATENT DOCUMENTS

| FI | FI-20060697 A | 1/2008 |
| WO | WO-2005/104226 A2 | 11/2005 |
| WO | WO-2007/004033 A2 | 1/2007 |
| WO | WO-2007/038950 A1 | 4/2007 |
| WO | WO-2008/009779 A1 | 1/2008 |

OTHER PUBLICATIONS

N. R. Bieri, et al., Microstructuring by Printing and Laser Curing of Nanoparticle Solutions, Applied Physics Letters, vol. 82, No. 20, pp. 3529-3531, XP012034149, May 19, 2003.
Mark L. Allen, et al., "Electrical Sintering of Nanoparticle Structures", Nanotechnology 19 (2008)175201, XP020136442, pp. 1-4.

(Continued)

*Primary Examiner*—Charles D Garber
*Assistant Examiner*—Cheung Lee
(74) *Attorney, Agent, or Firm*—Birch, Stewart, Kolasch & Birch, LLP

(57) ABSTRACT

This publication discloses a method for forming electrically conducting structures on a substrate. According to the method nanoparticles containing conducting or semiconducting material are applied on the substrate in a dense formation and a voltage is applied over the nanoparticles so as to at least locally increase the conductivity of the formation. According to the invention, the voltage is high enough to cause melting of the nanoparticles in a breakthrough-like manner. With the aid of the invention, small-linewidth structures can be created without high-precision lithography.

18 Claims, 14 Drawing Sheets

OTHER PUBLICATIONS

C. R. Knutson, et al., "Self-Assembled Contacts to Nanoparticles Using Metallic Colloidal Spheres", XP-002562811, pp. 1-7.

T. Castro, et al., "Size-Dependent Melting Temperature of Individual Nanometer-Sized Metallic Clusters", Physical Review B, vol., 42, No. 13, Nov. 1, 1990, pp. 8548-8557.

S. Sivaramakrishnan, et al., "Controlled Insulator-to-Metal Transformation in Printable Polymer Composites with Nanometal Clusters", XP-002562813, Dec. 17, 2006, pp. 149-155.

* cited by examiner

METHOD FOR PRODUCING CONDUCTOR STRUCTURES AND APPLICATIONS THEREOF

FIELD OF THE INVENTION

The invention is related to producing electrically induced conductor structures on substrates using nanoparticles. The invention is particularly advantageous in the field of printed electronics.

BACKGROUND OF THE INVENTION

It is generally well known that conductors can be fabricated via depositing metallic nanoparticle suspensions (typical particle size 1 ... 100 nm) on a substrate and thermally sintering the structure. A typical example are the commercially available silver nanoparticle suspensions which can be printed on plastic or paper substrates and sintered at plastic/paper-compatible temperatures (T<200 C) [for example, silver nanoinks by Cabot Inc. and Harima Chemicals Inc]. The low sintering temperature is based on the dramatic depression of the melting point encountered in nanoparticle systems [see e.g. T. Castro et al. Size-dependent melting temperature of individual nanometer-sized metallic clusters, Phys. Rev. B 42, 8548 (1990)].

The suspensions (liquid containing solid particles) are realized by suitably coating the metallic nanoparticles e.g. using a thin polymer shell. Following the deposition on a substrate and the evaporation of the liquid carrier, the coating between the nanoparticles gives way to sintering of the metallic nanoparticles during thermal treatment. As a result, conductor structures, such as printed circuit boards, can be formed using large volume direct-write printing techniques without the traditional patterning techniques (lithography and etching).

However, the realization of small-linewidth, functional structures in conventional printed electronics is difficult. Typical achievable inkjet minimum linewidths are tens of micrometers, and similar or larger for gravure printing. This is a strong restriction for production of devices such as transistors regarding the performance and the device size.

Patent Application FI 20060697, still unpublished when filing the present application, discloses a novel method sintering nanoparticles using electric field. In this method, the electrical voltage set across the deposited nanoparticle system results in sintering without the need for thermal treatment. FIG. 1 (prior-art) shows the results of our electrical sintering experiment on silver nanoparticle system. For each sintering distance ("gap") between the sintering electrodes, the bias voltage is continuously increased (the system conductivity simultaneously measured using a small-signal AC-method). At a certain voltage, that is proportional to the electrode gap, a dramatic reduction in resistivity is evident. FIG. 2 (prior-art) shows a scanning electron microscope view of the nanoparticle structure before (FIG. 2 (a)) and after (FIG. 2 (b)) the electrical sintering experiment. The structural transformation induced by the electrical sintering is clearly visible by comparing FIGS. 2a and 2b. In our experiments, the conductivities obtained via the electrical sintering method and the conventional thermal sintering method do not significantly differ.

The publication "Controlled insulator-to-metal transformation in printable polymer composites with nanometal clusters", S. Sivaramakrishnan, et al., Nature Materials 6, 149 (2007); P. Ho, et al. and Patent Application WO 2007/004033 A2 disclose another method for achieving sintered structures by using electric voltage. In the method, electrical pathways are formed through a layer or nanoparticle material between two conducting surfaces.

US 2004/0085797 discloses a method for changing the state of nano- or microparticles by means of electric DC voltage. The voltage is applied by electrodes located on surfaces of a flexible, gel-like layer containing dispersed particles, whereby the particles orient aligned to the electric field or form clusters, the conductivity of the structure being locally increased. The method is not well suitable for producing non-volatile structures and cannot be used for forming conductor wires on surfaces.

WO 2005/104226 discloses a method for fabricating through-contacts in semiconductor chips by applying a very high (>1 kV) voltage burst through a nanoparticle-containing layer. The method cannot be used for forming conductor wires on surfaces.

US 2007/0099345 discloses a method for producing through-contacts through a panel-shaped composite body containing plastic mass filled with conductive particles. A voltage is applied through the mass for fusing or sintering the conductive particles with each other and for converting the plastic mass into conductive carbon bridges. As a result, a conductive through-contact is formed. The method is suitable for contacting semiconductor chips on different sides of the composite body. However, the method can not be used for producing conductors laterally on a surface of a substrate.

In summary, although the many advantages of the known electrical sintering methods, they do not allow for producing very small-linewidth conductor structures on substrates.

SUMMARY OF THE INVENTION

It is an aim of the invention to provide a method for producing structures having a smaller linewidth than previous sintering methods. In particular, it is an aim of the invention to provide a method that can be conveniently combined with surface deposition methods, such as printing, in order to produce functional electrical components without high-precision lithography.

The invention is based on the idea of initiating in a nanoparticle-containing layer a melting process that propagates in the layer in a breakthrough-like manner producing wire-like formations on the surface of the substrate. We have found that a voltage causing a high electric field density in the vicinity of the voltage electrodes starts a novel kind of self-organized structural transformation phenomenon which results in a thin uniform wire electrically connecting the electrodes, provided that the nanoparticle layer is dense enough. The required field density and localization of the wire-like formation can be achieved by using point-like (e.g. tapering) electrodes.

In the method according to the invention electrically conducting or semiconducting structures are formed on a substrate comprising a nanoparticle-containing layer. In the method, voltage is applied in lateral direction over the nanoparticle layer so as to locally increase the conductivity of the layer, the voltage being high enough to cause melting of the nanoparticles in a breakthrough-like manner. After the process, the nanoparticle layer has been converted into a high-quality filament on the substrate.

The electronics unit according to the invention comprises a substrate and a conducting wire connecting two operational parts of the unit. According to the invention the wire is formed by converting a conductive nanoparticles-containing layer locally into a filamentary pathway on the surface of the substrate by applying to said layer a voltage capable of causing a breakthrough-like melting of the nanoparticles. The resulting structure is a structurally unique pattern of fully coalesced nanoparticles.

More specifically, the method and electronics unit according to the invention are characterized in the independent claims. Advantageous embodiments are characterized in the dependent claims.

Both conducting and semiconducting nanoparticles can be used in the nanoparticle layer. According to a preferred embodiment, the nanoparticles are dispersed in a suspension forming a "nanoink" that can be printed or aerosol-deposited. It is also beneficial that the particles are encapsulated, whereby they do not form clusters prior to melting, but the nanoparticle stays homogeneous. By this way, uniform wires can be quarantined.

It has been observed that the breakthrough ideally propagates between the electrodes like an avalanche originating essentially from at least one of the electrodes, that is starting at (or in the vicinity of) one electrode and propagating towards the other such that the electrodes are connected. This is contrary to the known electrical sintering process utilizing low field strengths and disclosed in FI 20060697, where the sintering starts in the middle of the electrodes and proceeds towards the electrodes. The breakthrough is a very fast phenomenon taking place soon after the voltage is applied and a temperature high enough has been achieved for the nanoparticles. The melting is followed by recrystallization of the molten and coalesced nano material.

For achieving a sufficient field density and for being able to accurately define the place of formation of the wire, electrodes are used, which are tapering towards the end, that is, point-like. The electrodes may be external or integral parts of the structure, for example, printed and sintered conductor structures.

Nanoparticles and voltage exposure are preferably chosen such that substantial reduction of volume of said formation takes place due to the breakthrough. This results in a gap between the wire and the untransformed particles. That is, the wire formation can be arranged such that the wire is automatically electrically isolated from the surrounding nanoparticles. This provides for several advantages in practical applications of the invention.

In particular by using nanoparticles having thin volatile encapsulation layers, complete melting and recrystallization, i.e. full coalescence and recrystallization of the of the nanoparticles is achieved. Thus, no carbon bridges are required for achieving full conductivity, as in US 2007/0099345. At the same time, a gap is formed between the wire and the surrounding nanoparticle-containing layer, as the volatile encapsulation layers volatilize.

As shortly referred to above, the step of applying the nanoparticles may comprise printing the nanoparticles as components of a nanoparticle-polymer composite ink or the like. Thus, the invention suits for printed electronics applications.

By wire-like structures are meant filaments having a relatively constant width and large aspect ratio. The wires can take the place of conventional printed and thermally sintered conductors in printed electronics. Alternatively, the wires may serve as small linewidth portions in components which have been impossible or difficult to manufacture using conventional printed electronics methods. These include, for example, transistors and sensors, such as bolometers.

By point-like electrodes are meant small-tipped electrodes which cause the ends of the wire to localize consistently to the desired place on the substrate. In addition to using a tapering electrode, which automatically localize an end of the wire to the narrowest point thereof, the desired localization can be achieved by using e.g. a cylindrical or a rectangular electrode having a constant small width.

Depending on the electrode tip size, which is preferably less than 100 μm, in particular less than 100 μm, and may be considerably less, a voltage per electrode gap length of 0.001-500 V/um can be used. When large-tipped electrode probes have been used, a voltage of 0.001 V/um has been found to be sufficient. A needle-like electrode may require a voltage of 500 V/um in order for the field density to be sufficient for initiating the process.

The invention offers significant benefits. First of all, it allows creating small-linewidth structures without high-precision lithography. Secondly, when comparing with laser curing, the invented method offers the production of smaller linewidths, better applicability for thicker layers (t>>20 nm) and using of larger particles (d>>2 nm). At the same time, problems related to power transfer (reflection from metallic surface) in sintering by optical wavelengths. In addition, the present method of producing wires and the wire resulting topology offer additional functionality and novel application areas.

The wire formation can be induced at voltage levels, which are reasonable for practical purposes, that is, with voltages typically below 0.5 kV. Linewidth can be controllably varied from nanowires to macrowires. Uniform, that is, constant, wire width can be produced due to self-controlled creation mechanism. Also wire resistance can be controllably varied. Possible applications include printed devices benefiting from the small linewidths and/or wire-topology: resistors (programmable), transistors, sensors (e.g. bolometers) etc.

The substrate may comprise a paper, a cardboard or a polymer film, for example.

DETAILED DESCRIPTION OF THE INVENTION

Figure 3:
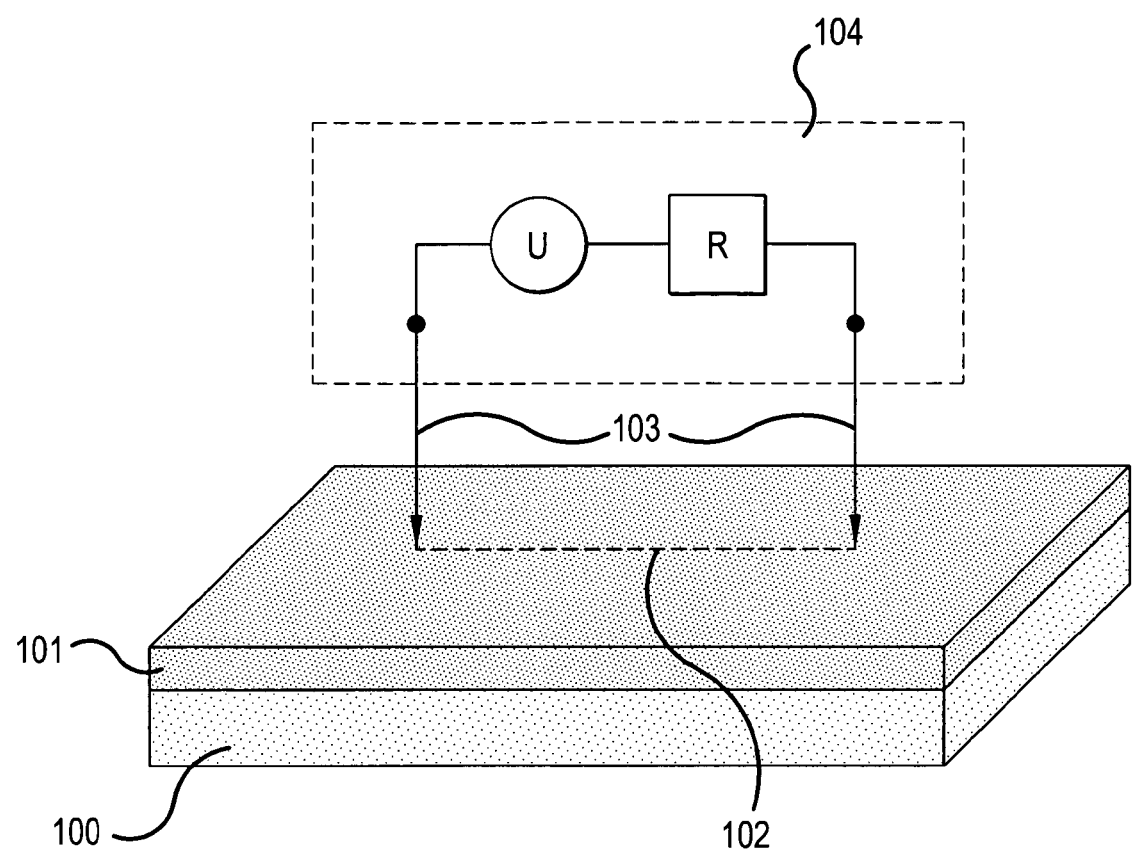
FIG. 3. One of the preferred embodiments of the invented method. Two probe-like electrical contacts and a programmable voltage source (impedance controllable) are applied to induce the electrically induced wire-like structural transformation in the nanoparticle layer.

While performing electrical sintering experiments on silver nanoparticle systems, it has been discovered that under suitable conditions a rapid breakthrough-like phenomenon can be electrically induced in a nanoparticle assembly. The typical method and the setup is illustrated in FIG. 3. The nanoparticle layer 101 is first deposited on a substrate 100. After the layer being suitable (e.g. having been dried) for creating electrical contacts to it, the two probe-like electrodes 103 are brought into contact with the nanoparticle layer. A sufficiently high electrical voltage is then applied between the electrodes using the apparatus 104 which typically is a programmable voltage source (featuring controllable voltage and current, or a voltage source and a bias resistor at simplest). As a result of the suitably high voltage applied, a wire-like conducting structure 102 (illustrated schematically by the dashed line) is created between the point contacts.

Figure 4:
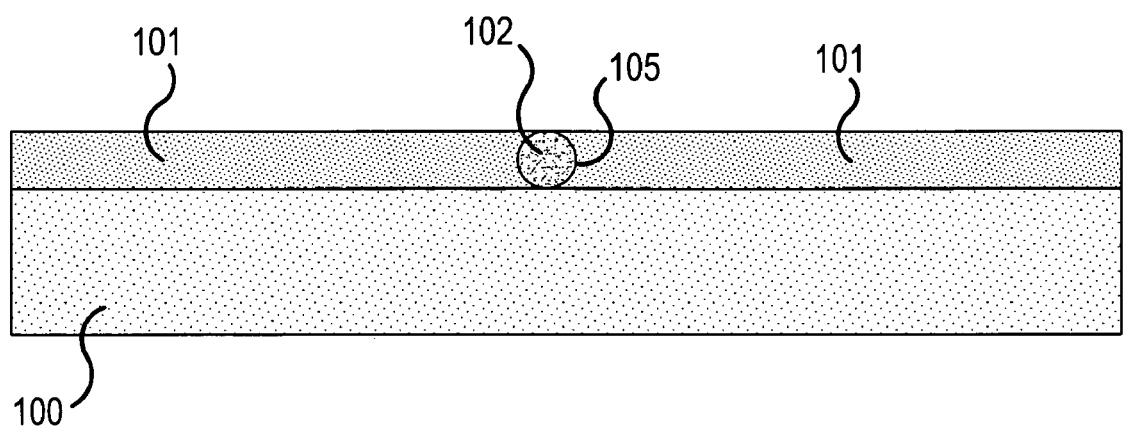
FIG. 4. Side view of the induced wire-like structural transformation.

The wire 102 cross-section is typically of circular shape as schematically shown in the cross-sectional view of the structure in FIG. 4.

Figure 5:
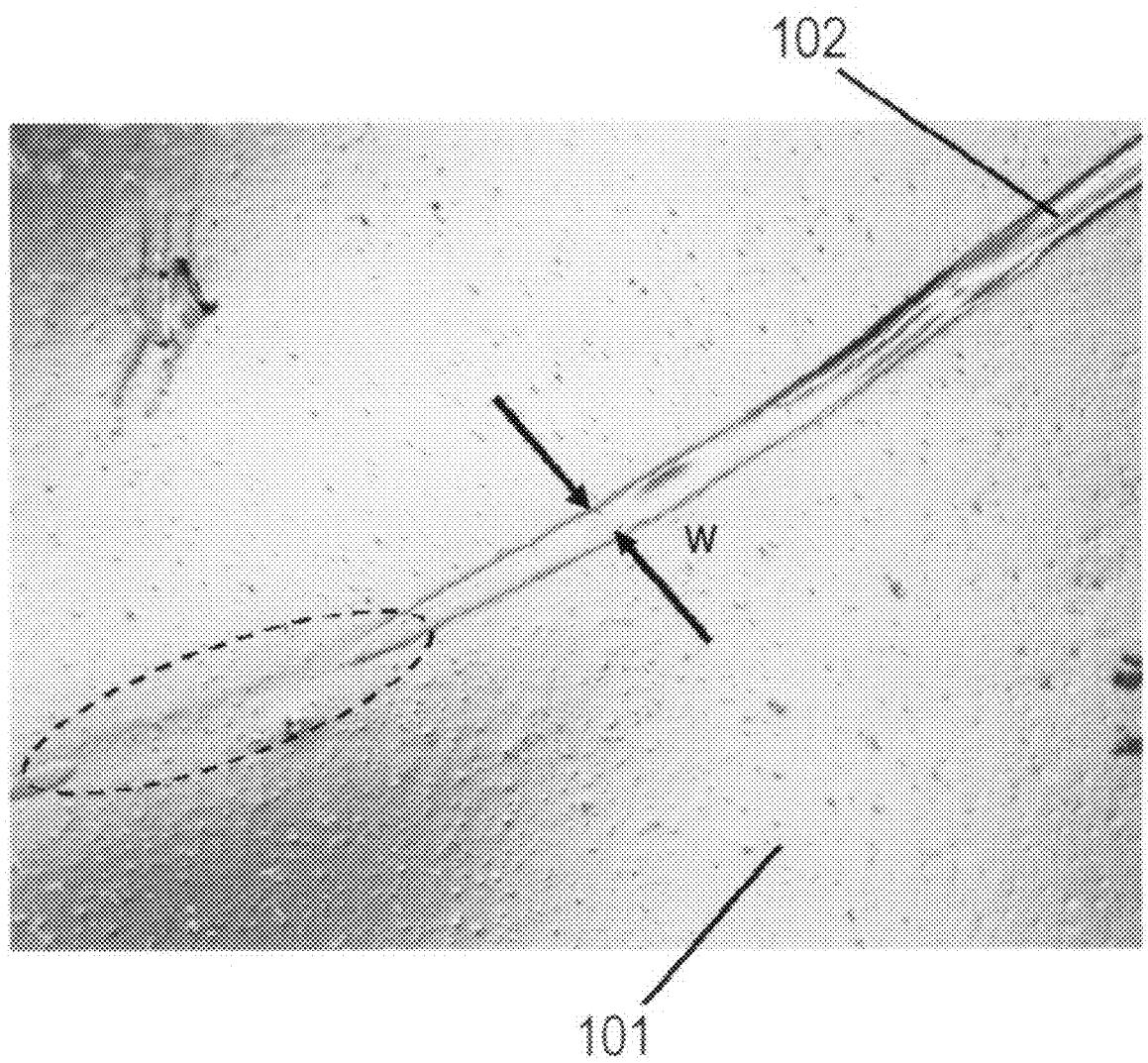
FIG. 5. Optical microscope view of an experimentally produced wire-like structure in silver nanoparticle array.

The optical microscope view of the electrically induced structural transformation is shown in FIG. 5. The width w of the "wire" induced using relatively large contact-area laboratory clips is approximately 100 um. The voltage used was Udc~40V between the clips. The induced "wire" 102 can also be induced under the nanoparticle layer 101 surface: as shown in FIG. 5 (the ellipsoidal area, dashed circumference) the wire is seen to "dive" under the material surface while surfacing elsewhere.

Figure 6:
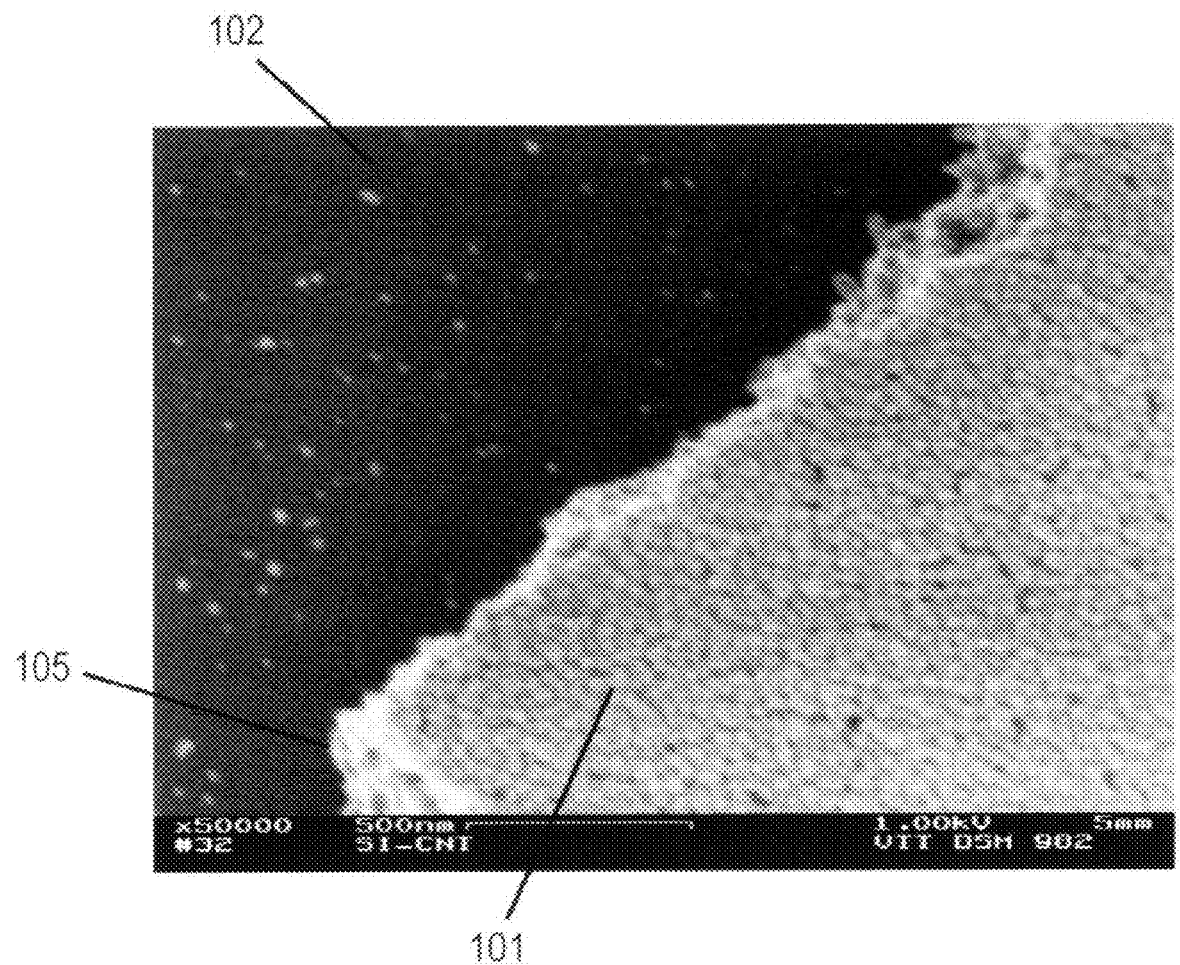
FIG. 6. Scanning electron microscope (SEM) view of an experimentally produced wire-like structure in silver nanoparticle array.

FIG. 6 shows a SEM (Scanning Electron Microscope) zoomed-in view of the edge of the wire in FIG. 5. It can be clearly seen that the morphology of the wire 102 is distinct from the surrounding nanoparticle array 101: in the wire 102, traces of individual nanoparticles cannot be seen but a complete melting and subsequent recrystallization is apparent.

As the wire-structure has undergone melting and recrystallization, the removal of surrounding original nanoparticle array can be made using e.g. solvent attacking the spacer (e.g. polymer) material in the nanoparticle matrix.

Large volume change (shrinking) is typically related to the wire creation. A volume change $\Delta V/V_o \sim -25\%$ is estimated for melting of ideal fcc-packed spheres. An additional volume change related to removal of encapsulation layer $\Delta V/V_o \sim -30\%$ (particle diameter 20 nm, thickness of encapsulation layer 1 nm) is further estimated.

A clear indication of the large volume change is the ditch-like structure (ellipsoidal area) shown in FIG. 5.

Due to the large volume change, the induced wire 102 can be separated by a gap 105 from the remaining nanoparticle array 101, as evident in FIG. 6 and schematically shown in FIG. 4. The gap is very thin and opens the possibility to realize narrow-linewidth structures, such as transistors and sensors, as explained in more detail below.

Figure 7A:
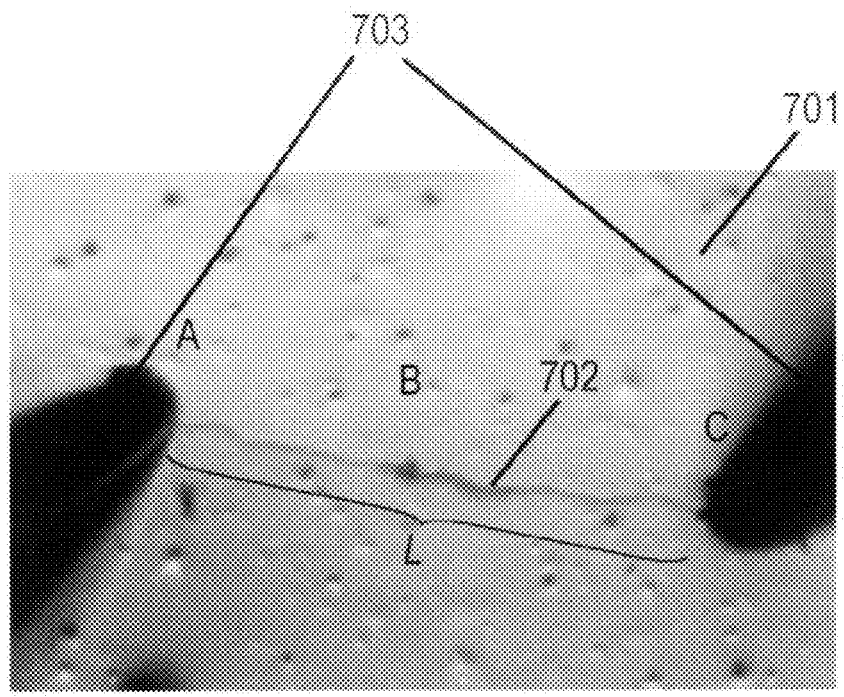
FIG. 7. Optical microscope view of an experiment in which a wire-like structure is produced in silver nanoparticle array using probe needles.
Figure 7B:
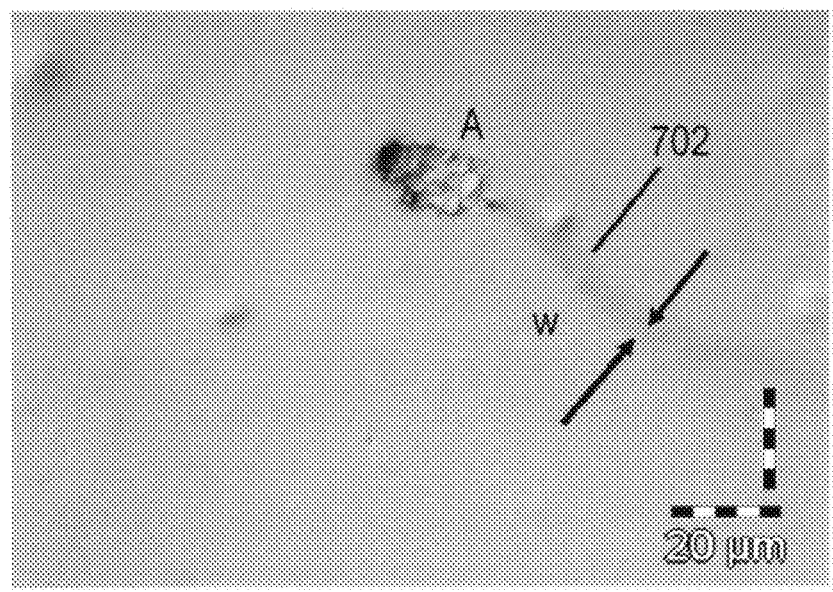

The induced wire width is proportional to the electrode contact size. The wire (w~100 um) in FIG. 5 is created using standard laboratory clips for which the estimated contact area diameter is a few hundred micrometers. FIGS. 7a and 7b show another significantly narrower (width w<10 um) wire which is created using sharp probe needles. Udc~100 V and a current setting of i~2 mA in a compliance power source were used. FIG. 7b is an enlarged view of the area near the left probe contact (at point indicated by A) after probe being removed.

Nanosize wires (d<<1 um) can be created using even smaller electrode contacts, realized e.g. using AFM (atomic force microscope) or similar equipment.

The wire width shows highly uniform width due to the self-organized creation mechanism. The relatively smooth path of the created wire (FIGS. 5 and 7) suggests that significant (thermal) inertia to be involved in the wire creation process.

The wire aspect-ratio (length/width) is large. For the "wire" in FIG. 5, w~100 um while the length is several millimeters. In FIG. 7, the aspect ratio L/w~300 um/10 um~30.

The "wire" 702 in FIG. 7a was created in two phases. First, probe tips 703 were placed at points A and B in the silver nanoparticle layer 701 to induce the "wire" formation between the points A-B (indicated in FIG. 7a). Then, after switching off the electric voltage, the other probe was moved to the point C (the other remaining at A). After raising the voltage between probes located at A and C, the wire between B and C was induced and the wire between A and C completed.

Figure 1:
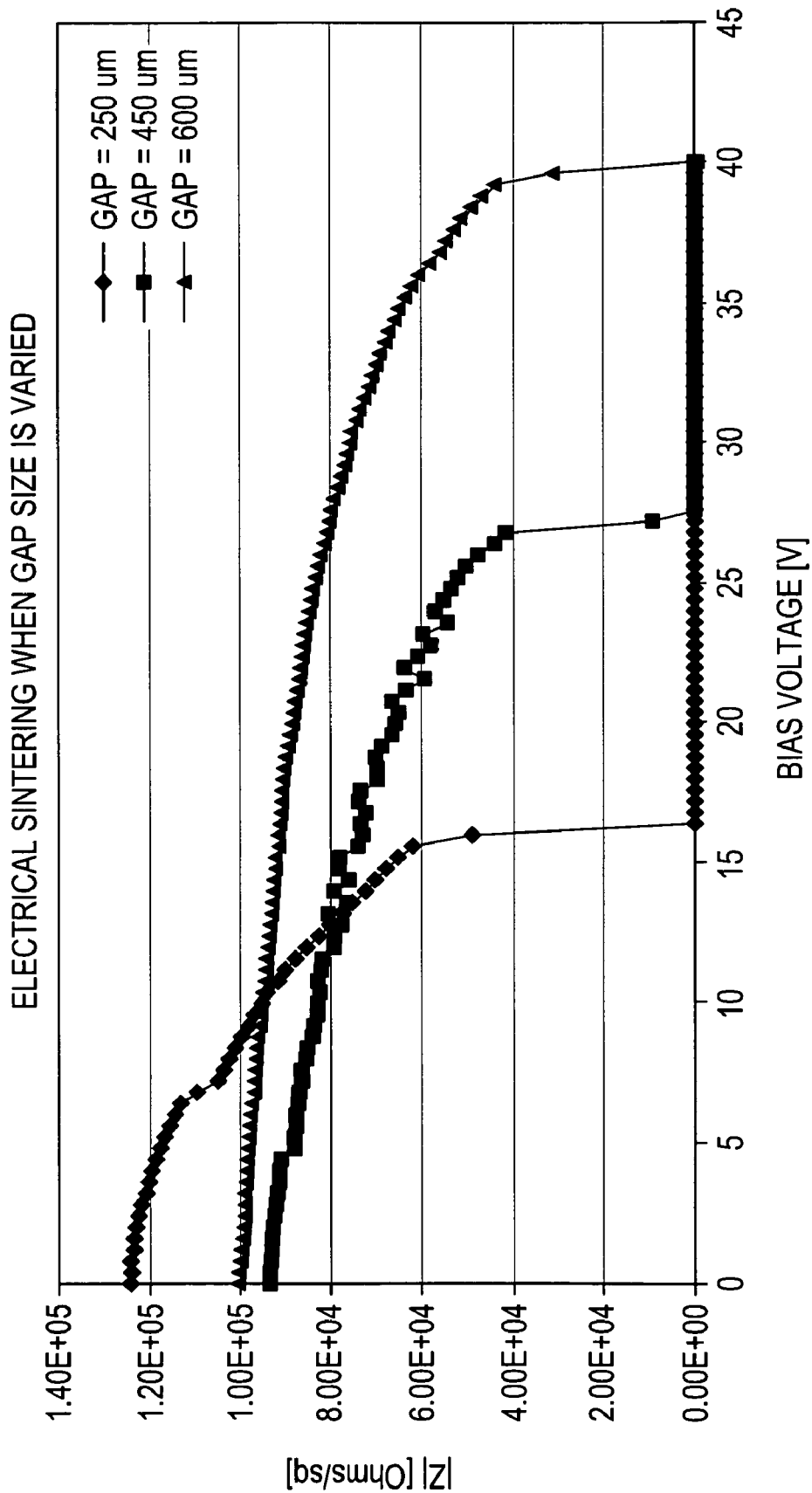
FIG. 1 (prior-art). Resistivity drop observed in the electrical sintering experiment.
Figure 2A:
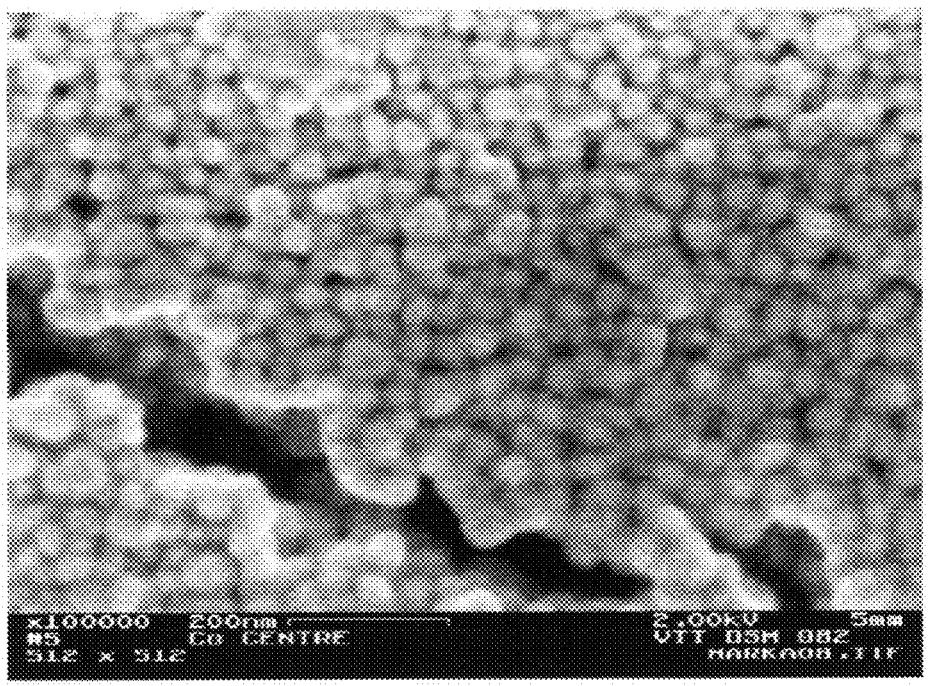
FIG. 2 (prior-art). A scanning electron microscope view of the nanoparticle structure (a) before and (b) after the electrical sintering experiment.
Figure 2B:
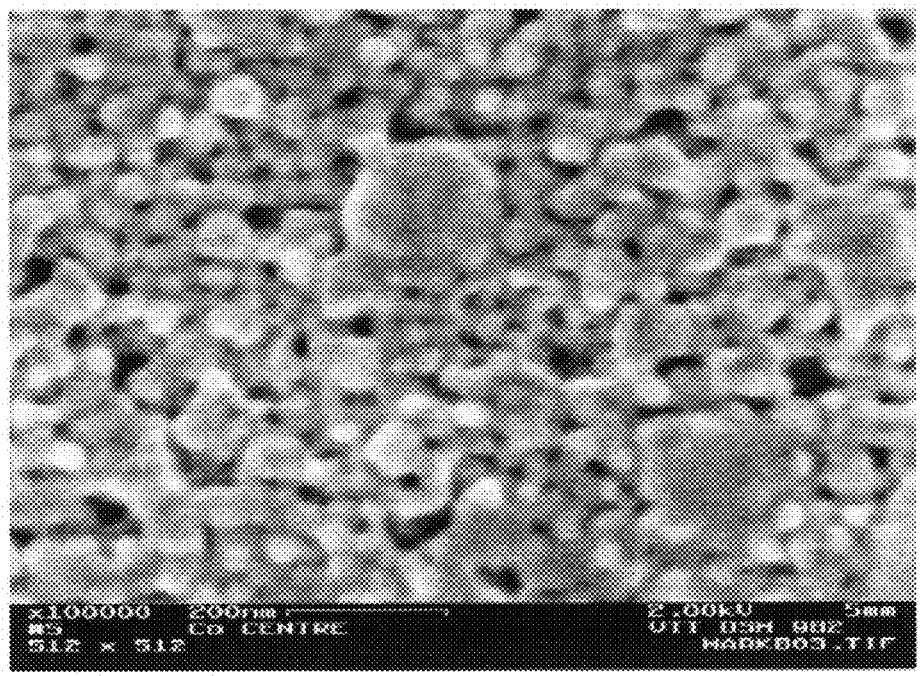

It is essential to note that the wire structure is distinct from the outcome of electrical sintering approach, FI 20060697, where, contrary to this, nanoparticle melting is not complete and traces of original nanoparticles can be seen (FIG. 2b prior-art).

Figure 8:
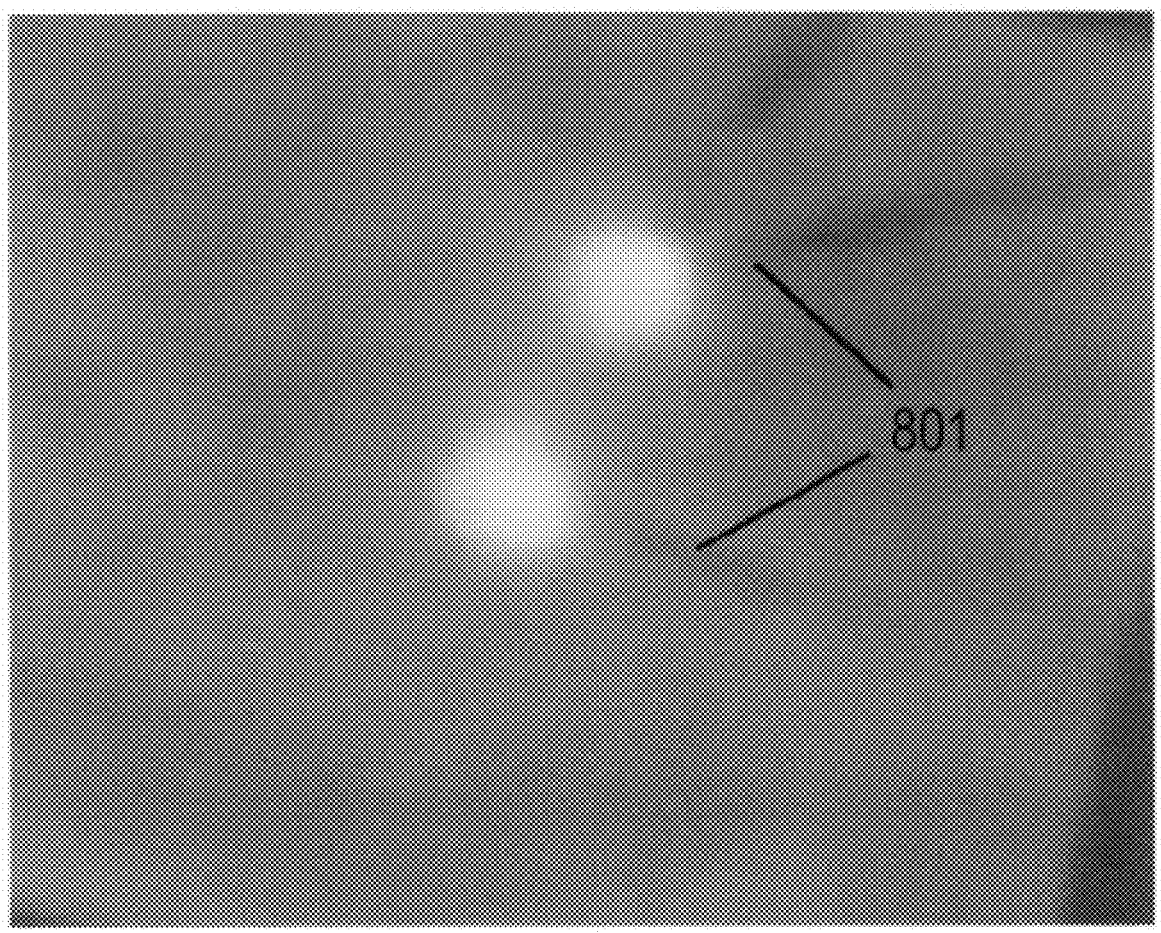
FIG. 8. Infrared ($\lambda_{peak}$~10 uM) image of the wire-induction experiment using the probe needles.

A key enabling factor in wire formation is the sufficiently high applied voltage. FIG. 8 shows a thermal image (thermal image sensor most sensitive at $\lambda \sim 10$ um, temperature scale illustrated by the color) at the initial phase of inducing the structural transformation between the probes 801. The largest heating is clearly visible at the two point-like probe contacts. After raising the voltage sufficiently, the wire-like structure is formed in a breakthrough- or avalanche-like phenomenon between the contacts. The process is very fast: in our experiments, the maximum thermal image capture rate (50 frames/s) is insufficient to visualize the actual progress of the wire formation. No trace of the wire is visible in one frame while the next one (taken after 20 ms) shows the completed wire.

Figure 9:
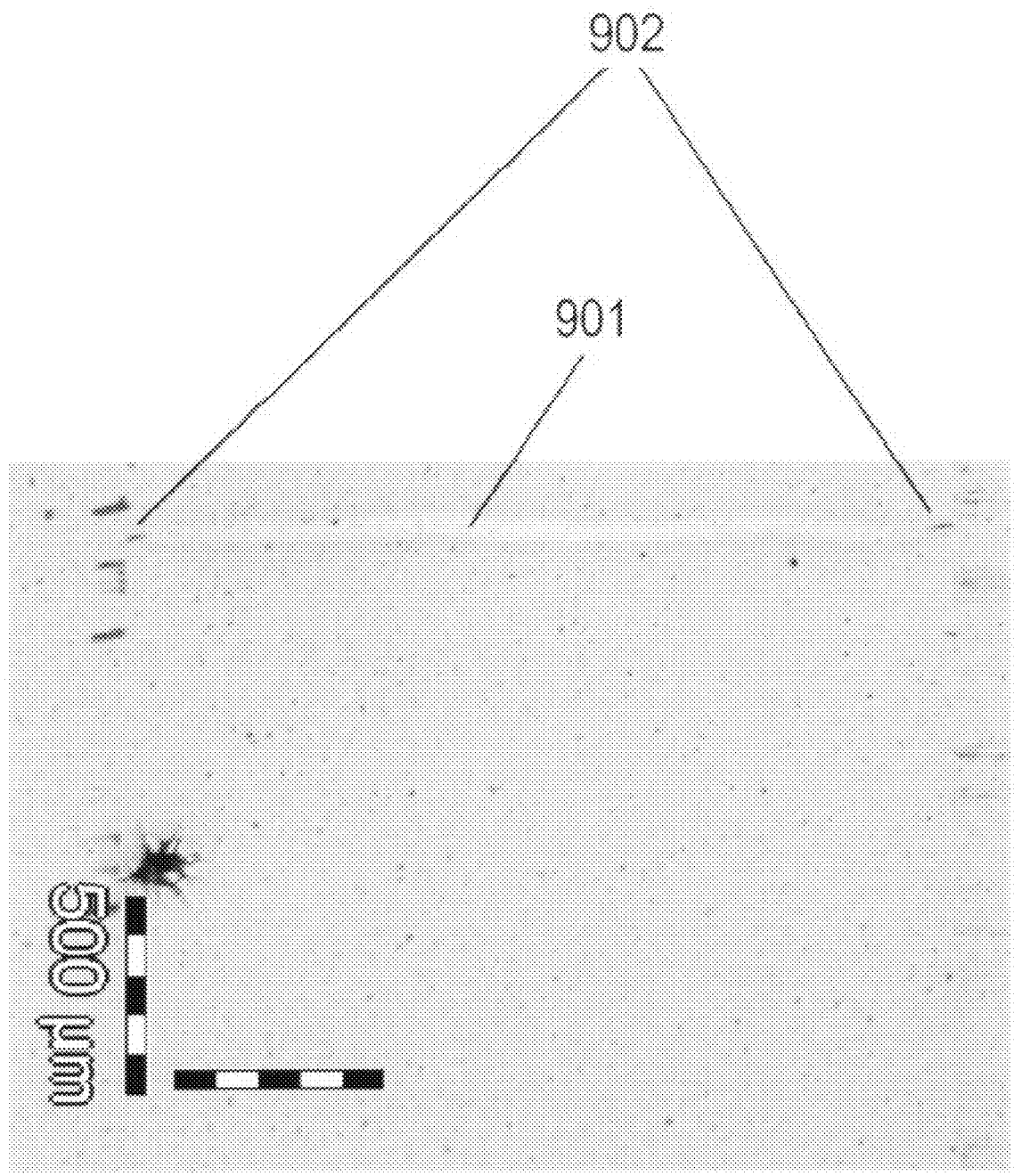
FIG. 9. Optical microscope view of a wire-like structural transformation due to the point-contacts formed between the nanoparticle array and the plate electrodes.

FIG. 9 illustrates an outcome of an experiment using large-area planar metal electrodes (Cu conductors on printed circuit board) placed in contact of a silver nanoparticle layer originally in order to induce a narrow but wide electrically sintered area (only a small portion of the area shown in FIG. 9). However, it was surprisingly found that a wire-like structure 901 was formed between unintentional point-contacts 902. The point contacts 902 are formed between the nanoparticle array and the large-area planar metal electrodes (Cu conductors on printed circuit board) as perfectly even planar surfaces (galvanic contacts) are difficult to realize. As disclosed above in detail, according to a preferred embodiment of the invention, this phenomenon is utilized for inducing narrow wire-like structures between predefined locations by means of point-like electrodes. However, also this kind of "unintentional" contacting may have some application areas.

After the well-conducting wire has been created, the structure heating is drastically reduced as power becomes dissipated in the series resistor or as the voltage is cut-off using e.g. a programmable power source.

The wire resistance typically ranges from a few ohms to tens of ohms, measured using the same galvanic probe contacts as for wire creation. The initial resistance of nanoparticle array between probe contacts is typically orders of magnitude larger (from a few kOhms to hundreds of kOhms). By varying the external series resistor values, the resulting wire resistance has been systematically controlled in our experiments. This opens the possibility to create resistors in the nanoparticle systems where the resistor values can be programmed post to printing. In addition for standard resistor usage, such elements can be utilized as programmable memory. The possibility to systematically control the induced resistor value allows multi-level operation (multiple bits per wire).

Typically a galvanic contact and a DC-voltage has been utilized for wire creation. However, it has also been witnessed that a capacitive (non-galvanic) contact and AC-voltage can be similarly used in wire creation process. The obvious central advantage includes the contactless processing.

Figure 10A:
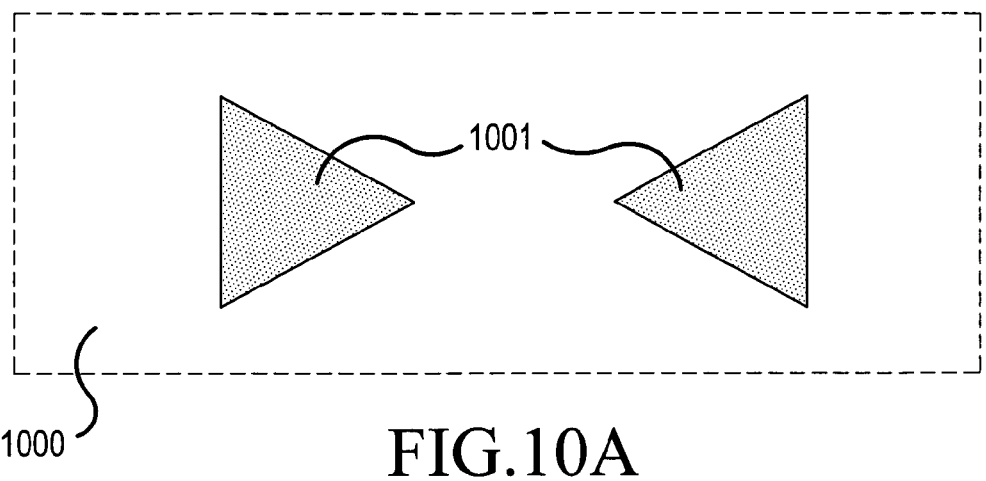
FIG. 10a-c. A preferred method for realizing wire-formation in nanoparticle array.
Figure 10B:
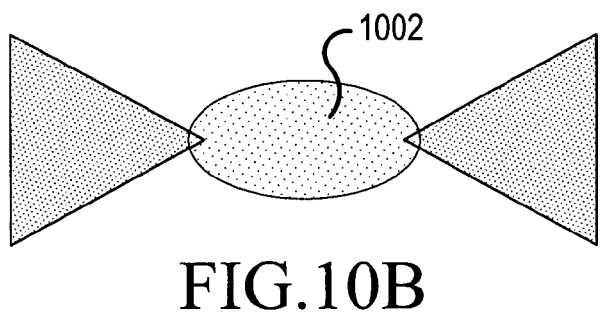
Figure 10C:
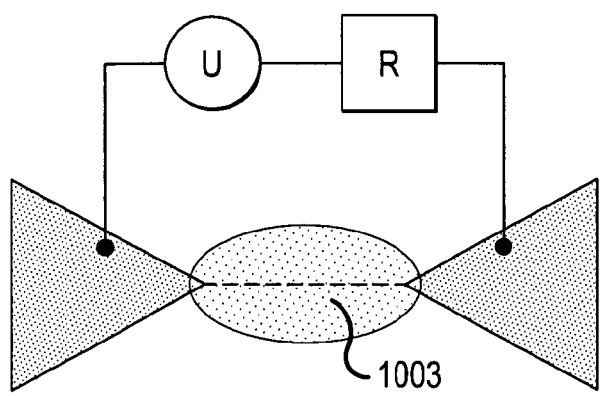

In addition to probe-like electrodes, the invented method can be realized using printed electrodes as shown in FIG. 10. In the first phase (FIG. 10a), the electrodes 1001 are deposited on a substrate 1000. In the second phase (FIG. 10b), the nanoparticle layer 1002 is deposited between the electrodes 1001 with partial overlap at the electrode tips. In the third phase (FIG. 10c), the wire 1003 is electrically induced between the electrodes 1001. The electrodes 1001 are preferentially shaped so that a desired small contact-area to the nanoparticle layer 1002 is achieved; this is essential for the creation of a wire of a desired width. There exist several preferred methods for realizing the electrodes 1001 and the nanoparticle layer 1002. For example, (i) Both can be deposited using printing methods, such as ink jet or gravure roll-to-roll method. In this case, also the electrodes 1001 can (but do not need to) be of the similar nanoparticle material as the nanoparticle layer 1002. After printing the electrodes 1001, they can be made conducting e.g. using conventional thermal sintering or using electrical sintering, for example as disclosed in the patent application FI 20060697;]. Optionally, it is possible to use nanoparticle material for the electrodes 1001 that sinters at lower temperature the material applied for the layer 1002.

(ii) The electrodes 1001 and the nanoparticle layer 1002 are deposited using heterogeneous methods. These include e.g. evaporation, sputtering, etching, patterning using photolithography etc. The material for the electrodes 1001 can obviously differ from that of the nanoparticle layer 1002.

One of the key advantages of the invention is that the deposition of the electrodes 1001 and the nanoparticle layer 1002 can be done using low-resolution methods e.g. printing. The small-linewidth final product, i.e. the "wire", is then obtained via a self-organized electrically induced structural transformation. In other words, e.g. high-precision lithography or equivalent high-resolution patterning techniques are not needed.

Figure 11:
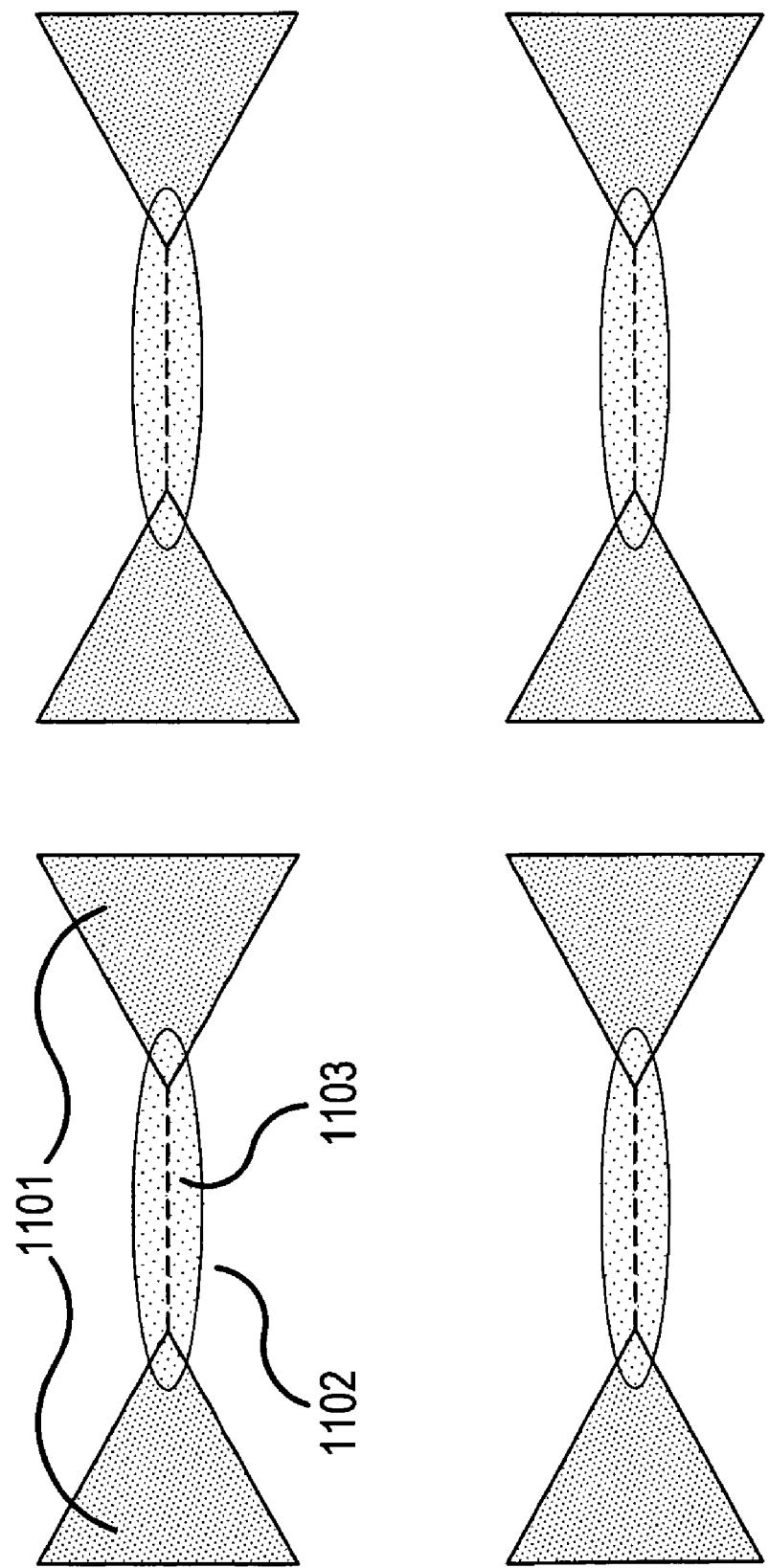
FIG. 11. A schematic view of a sensor array fabricated using the invented method.

An example of the preferred applications for the invention is a bolometer array shown in FIG. 11. Here, the large antenna patches 1101 are realized using standard (printing) techniques requiring only a coarse resolution. The nanoparticle layer 1102 is then deposited in the area separating the two patches. Via electrical contacts (not necessarily galvanic) to the antenna patches, the wire 1103 is created between them. The gap between the wire and remaining nanoparticle array provides electrical and thermal isolation. Alternatively, the remaining nanoparticle array can be removed. The printing-type methods allow the cost-effective fabrication of large bolometer arrays (if desired, significantly larger than the 2×2 array depicted in FIG. 11). The small size of the wire is essential for obtaining a high-performance bolometer.

Figure 12:
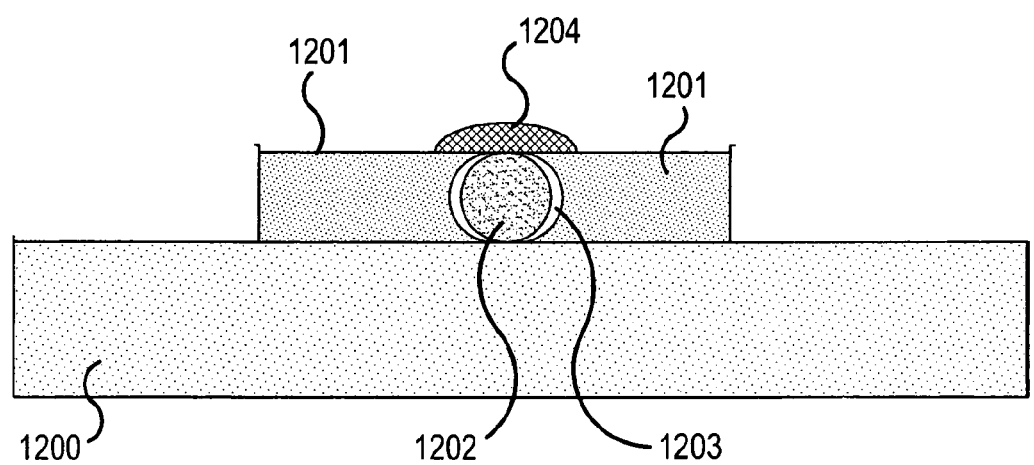
FIG. 12. A schematic view of a transistor structure fabricated using the invented method.

Another example of the preferred applications for the invention is the transistor structure shown in FIG. 12. Here, the nanoparticle material 1201 is first deposited on the substrate 1200. The "wire"-type structural transformation 1202 is then electrically induced. The gap between wire 1202 and the electrodes 1201 is optionally filled with an insulator 1203. The insulator 1203 may be used to provide an additional mechanical stability of the "wire" 1202 in the structure. Finally, the semiconducting material 1204 is deposited on top the structure. The semiconductor 1204 acts as the channel between the "drain" and "source" contacts 1201 in a field-effect transistor topology. The gate controlling the channel is formed by the "wire" 1202. The central advantage of the structure is that the narrow linewidth structure can be fabricated without high-precision lithography. The small linewidth is critical for achieving a high-performance transistor (speed, operation voltages, etc).

Figure 13:
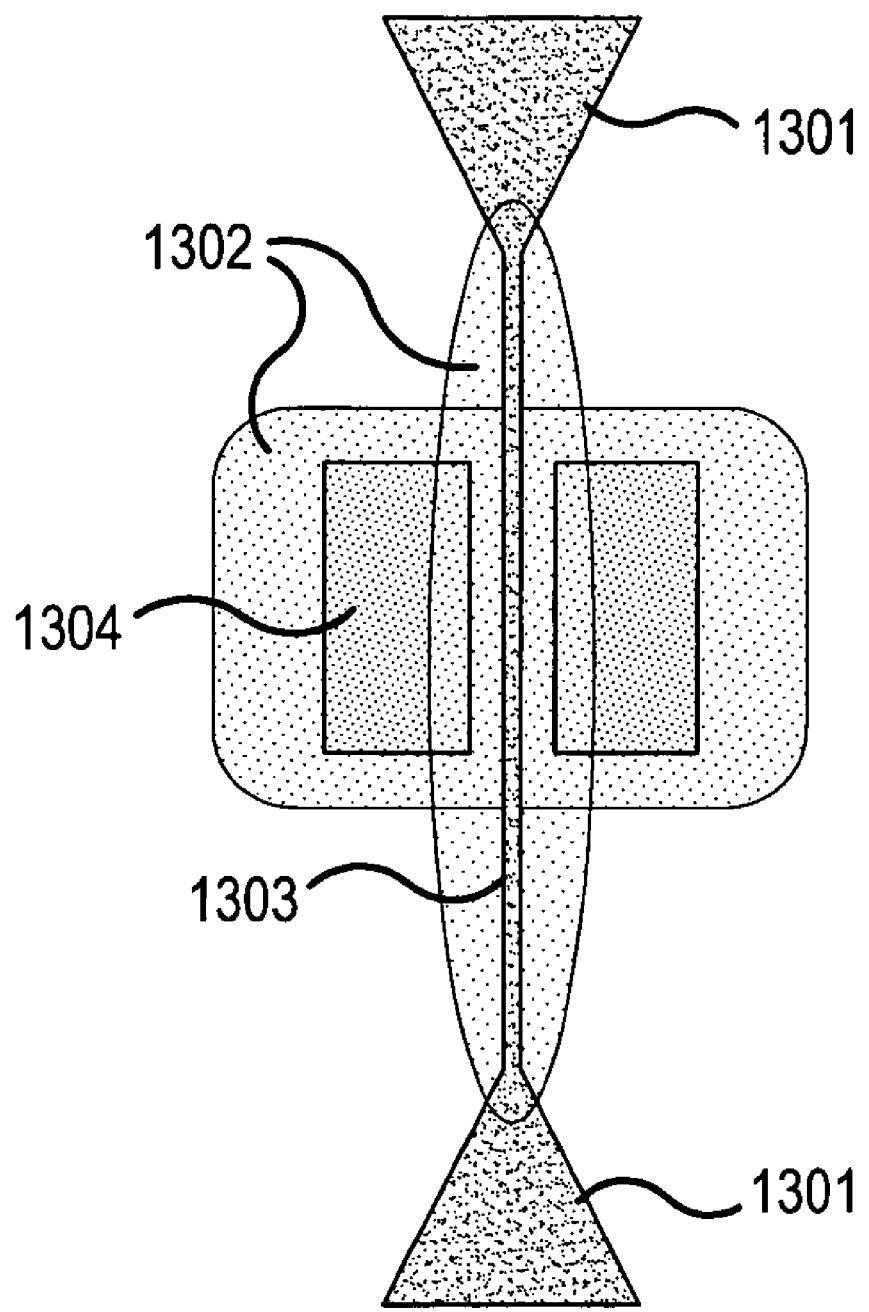
FIG. 13. A preferred method for realizing the source and drain contacts in the transistor structure.

FIG. 13 shows a top view of a preferred method for further realization drain and source electrodes in the transistor structure described in FIG. 12. Here, the gate contacts 1301 are first deposited. Then, the nanoparticle material 1302 is deposited on selected locations. Next, the "wire" 1303 is electrically induced. Finally, the source and drain electrodes 1304 are created using electrical sintering based on e.g. vertical, that is, through the substrate penetrating AC field on the desired locations. The remaining nanoparticle material between the gate contacts 1301 and the source/drain contacts 1304 can either remain (in case of being sufficiently insulating in the non-sintered phase) or can be selectively removed (e.g. using chemical etchant attacking the matrix material in the nanoparticle array).

Figure 14A:
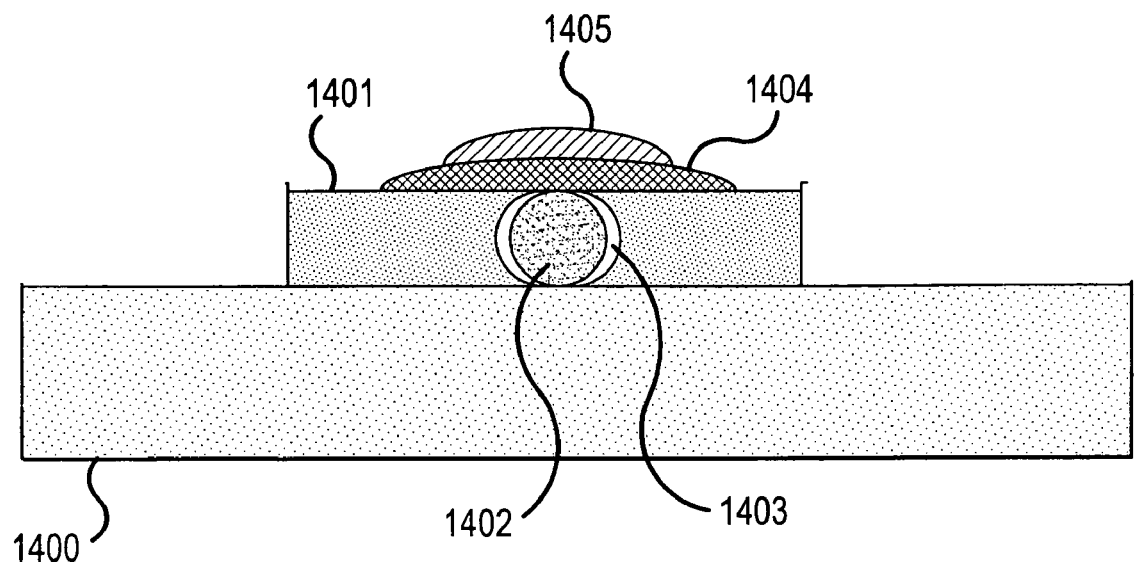
FIG. 14. A schematic view of another transistor structure fabricated using the invented method.
Figure 14B:
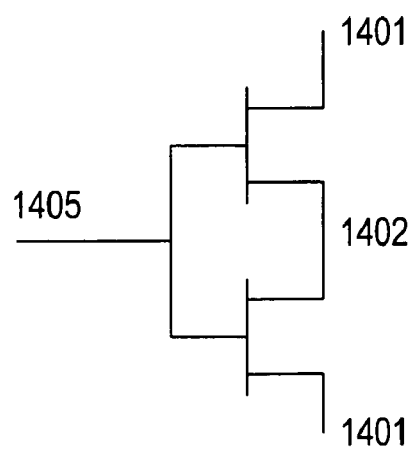

Another example of the preferred applications for the invention is the cascaded two-transistor structure shown in FIG. 14. Here, the nanoparticle material 1401 is first deposited on the substrate 1400. The "wire"-type structural transformation 1402 is then electrically induced. The gap between wire 1402 and the electrodes 1401 is filled with a semiconductor 1403. Then an insulator 1404 and finally, a gate conductor material 1405 is deposited on top the structure. The semiconductor 1403 acts as channels between the "drain" and "source" contacts 1401, 1402 of two cascoded field-effect transistors as shown in FIG. 14b. The wire 1402 acts as the drain of one and as the source of the other transistor or vice versa. The "gate", controlling the channels is formed by the upper most conductor layer 1405. The central advantage of the structure is that the narrow channel structure can be fabricated without high-precision lithography. The small linewidth is critical for achieving a high-performance transistor (speed, operation voltages, etc).

The invented method may be extended also beyond metallic nanoparticles (e.g. semiconducting nanoparticles).

The invented method may be restricted not only to printed devices but any nanoparticle system (especially nanowires).

The invention claimed is:

1. A method for forming electrically conducting or semiconducting pathways on a substrate comprising a nanoparticle-containing layer, the nanoparticles in the layer comprising conducting or semiconducting material, the method comprising applying a voltage over the nanoparticle-containing layer so as to locally increase the conductivity of the layer, the voltage being high enough to melt the nanoparticles in a breakthrough-like manner, wherein the voltage is applied from point-like electrodes laterally to the nanoparticle-containing layer in order to produce a wire-like formation on the substrate.

2. A method according to claim 1, wherein said melting propagates from one voltage electrode towards the other in an avalanche-like manner.

3. A method according to claim 1, wherein said melting is followed by recrystallization of the conducting or semiconducting material.

4. A method according to claim 1, wherein electrodes tapering towards their end are used.

5. A method according to claim 1, wherein encapsulated nanoparticles are used, the encapsulation layer of the nanoparticles preferably being polymeric.

6. A method according to claim 1, wherein such a voltage and nanoparticle-containing layer are used, which cause a substantial gap to be formed between said wire-like formation and the surrounding material by reduction of volume of the nanoparticle-containing layer on the location of the wire-like formation.

7. A method according to claim 1, wherein the step of applying nanoparticles comprises printing the nanoparticles, preferably as a nanoparticle-polymer composite ink.

8. A method according to claim 1, wherein wire formations having a large aspect ratio, preferably at least 30, are produced.

9. A method according to claim 1, wherein a voltage high enough is used so as to cause substantially complete melting of the nanoparticles, in particular a voltage per electrode gap length of 0.01-50 V/µm, in particular 1-50 V/µm, depending on the area of the voltage electrodes.

10. A method according to claim 1, wherein voltage electrodes having a separation of at least 100 µm are used.

11. A method according to claim 1, wherein a wire having a width of less than 100 µm, preferably less than 10 µm, even less than 1 µm is produced.

12. A method according to claim 1, wherein the voltage is applied by means of conducting electrodes permanently deposited on the substrate, the electrodes being deposited on the substrate, for example, by applying metallic nanoparticles on the substrate and sintering the metal nanoparticles thermally or electrically in order to form the conducting electrodes.

13. A method according to claim 1, wherein the voltage is applied by means of separate electrodes brought on the surface of the substrate.

14. Use of a method according to claim 1 for producing transistors or sensors, such as bolometers.

15. An electronics unit comprising a substrate and a conducting wire connecting two operational parts of the unit, wherein said wire is formed between point-like electrodes deposited on the substrate by converting a conductive nanoparticles-containing layer locally into a filamentary pathway on the surface of the substrate by applying to said layer a voltage capable of causing a breakthrough-like melting of the nanoparticles.

16. An electronics unit according to claim 15, wherein said unit is a transistor, said conducting wire being formed between terminals of the transistor.

17. An electronics unit according to claim 15, wherein the unit is a transistor pair, the gates of the transistors being connected by said conducting wire.

18. An electronics unit according to claim 15, wherein the unit is a bolometer, the conducting wire being formed between antenna patches of the bolometer.

* * * * *